United States Patent
Higashida et al.

(10) Patent No.: US 8,237,359 B2
(45) Date of Patent: Aug. 7, 2012

(54) DISPLAY APPARATUS

(75) Inventors: Takaaki Higashida, Osaka (JP); Yoshie Iwane, Osaka (JP); Hisao Nagai, Osaka (JP); Kazuhiro Nishikawa, Osaka (JP); Hiroshi Hayata, Osaka (JP)

(73) Assignee: Panasonic Corporation, Osaka (JP)

( * ) Notice: Subject to any disclaimer, the term of this patent is extended or adjusted under 35 U.S.C. 154(b) by 459 days.

(21) Appl. No.: 12/490,673

(22) Filed: Jun. 24, 2009

(65) Prior Publication Data

US 2009/0322718 A1 Dec. 31, 2009

(30) Foreign Application Priority Data

Jun. 24, 2008 (JP) ................... 2008-164230
May 28, 2009 (JP) ................... 2009-128532

(51) Int. Cl.
*H01J 1/62* (2006.01)
(52) U.S. Cl. .................. 313/506; 313/500; 313/505
(58) Field of Classification Search ........... 313/498–512
See application file for complete search history.

(56) References Cited

U.S. PATENT DOCUMENTS

| 6,870,186 | B2 | 3/2005 | Park et al. | |
| 7,781,964 | B2 * | 8/2010 | Hara et al. | 313/509 |
| 7,888,860 | B2 * | 2/2011 | Sung et al. | 313/504 |
| 2003/0201445 | A1 | 10/2003 | Park et al. | |
| 2007/0216280 | A1 * | 9/2007 | Hara et al. | 313/463 |
| 2008/0048560 | A1 * | 2/2008 | Sung et al. | 313/504 |

FOREIGN PATENT DOCUMENTS

| JP | 10-189252 | 7/1998 |
| JP | 2003-66859 | 3/2003 |
| JP | 2004-6337 | 1/2004 |
| JP | 2004-327215 | 11/2004 |
| JP | 2005-208423 | 8/2005 |

* cited by examiner

*Primary Examiner* — Bumsuk Won
(74) *Attorney, Agent, or Firm* — Wenderoth, Lind & Ponack, L.L.P.

(57) ABSTRACT

There is provided a display apparatus configured by stacking a drive circuit substrate and a light-emitting substrate. Electrodes of the substrates are accurately aligned to be electrically connected to each other. A display apparatus is configured by stacking a drive circuit substrate having a drive circuit and a light-emitting substrate having a light-emitting unit including a pixel electrode to cause the drive circuit substrate and the light-emitting substrate to face each other, wherein on a stacked plane between the drive circuit substrate and the light-emitting substrate, an intermediate electrode connected to the light-emitting unit of the light-emitting substrate and a connection electrode connected to the drive circuit and the drive circuit substrate are electrically connected to each other, and the intermediate electrode is elongated in a direction parallel to or perpendicular to a longitudinal direction of the pixel electrode on the stacked plane.

24 Claims, 13 Drawing Sheets

DISPLAY APPARATUS

BACKGROUND OF THE INVENTION

1. Field of the Invention

The present invention relates to a self-luminous display apparatus and, more particularly, to an electro-luminous display apparatus in which a light-emitting substrate having a light-emitting unit including an electro-luminous layer and an active matrix substrate having a drive circuit such as a TFT are stacked to each other.

2. Description of the Related Art

In OA equipment, AV equipment, mobile terminals, and the like, electro-luminous display apparatuses are used as display apparatuses which can achieve high-quality displays, small thicknesses, and low power consumptions. One of the electro-luminous apparatuses includes an organic electro-luminescence (EL) display apparatus using an organic electro-luminous layer. In the organic electro-luminescence display apparatus, a technique which drives a plurality of organic EL elements arranged in the form of an X-Y matrix by a simple matrix drive (passive drive) to display an image is known. Since this simple matrix drive has a finite number of scanning lines in execution of a linear sequential drive, an active matrix drive which is excellent in driving-ability is proposed. An organic EL display apparatus using the active matrix drive includes an active matrix substrate. The active matrix substrate has a transparent base substrate. On the base substrate, at least one thin film transistor (TFT) consisting of polysilicon or the like is arranged for each pixel. On the base substrate, a plurality of scanning electrode lines and a plurality of signal electrode lines to select and turn on the TFTs are arranged, and an organic EL layer is formed on the TFTs (for example, see Japanese Patent Laid-open Publication No. 10-189252).

A conventional improved self-luminous display apparatus will be described below.

As a structure of a self-luminous display apparatus, the following structure is proposed (for example, see Japanese Patent Laid-open Publication No. 2003-66859). The display apparatus includes an active matrix substrate and a counter substrate arranged to face the active matrix substrate. The active matrix substrate has a first base substrate. and a plurality of first pixel electrodes arranged on the first base substrate. The counter substrate has a second base substrate, an electrode layer formed on the second substrate on the first pixel electrode side, an electro-optic medium formed on the electrode layer on the first pixel electrode side, and a plurality of second pixel electrodes arranged on the electro-optic medium to face the plurality of first pixel electrodes, respectively. The self-luminous display apparatus further includes an electro-conductive connecting unit which electrically connects the first pixel electrodes on the active matrix substrate and the second pixel electrodes on the counter substrate to each other.

In manufacturing of a display apparatus including an active matrix substrate and a counter substrate arranged to face the active matrix substrate, the active matrix substrate and the counter substrate may be fabricated to be sequentially stacked, or the active matrix substrate and the counter substrate may be fabricated to be stacked to each other. As in the former, when the active matrix substrate and the counter substrate are to be fabricated to be sequentially stacked, if the steps to manufacture substrate parts are different in yield from each other, efficiency is considerably poor because the efficiency depends on the step having a low yield. On the other hand, when the active matrix substrate (also called a "drive circuit substrate") and the counter substrate (also called a "light-emitting substrate") are to be fabricated to be stacked to each other, in comparison with the fabrication performed by sequentially stacking the substrates, the efficiency is not easily influenced by the step having a low yield. However, it is very difficult to accurately align electrodes of the substrates and electrically connect the electrodes to each other.

SUMMARY OF THE INVENTION

It is an object of the present invention to provide a display apparatus configured to stack a drive circuit substrate and a light-emitting substrate, electrodes of the substrates are accurately aligned to be electrically connected to each other. Furthermore, it is another object of the present invention to provide a display apparatus having a long emission lifetime and a small fluctuation in display.

A display apparatus of the present invention is configured by stacking a drive circuit substrate having a drive circuit and a light-emitting substrate having a light-emitting unit including a pixel electrode to cause the drive circuit substrate and the light-emitting substrate to face each other, wherein on a stacked plane between the drive circuit substrate and the light-emitting substrate, an intermediate electrode connected to the light-emitting unit of the light-emitting substrate and a connection electrode connected to the drive circuit of the drive circuit substrate are electrically connected to each other, and wherein the intermediate electrode is elongated in a direction parallel to or perpendicular to a longitudinal direction of the pixel electrode on the stacked plane.

The intermediate electrode may have an area larger than that of the pixel electrode connected to the intermediate electrode.

The intermediate electrodes may have areas arranged in an order of area size of the connection electrodes.

The light-emitting unit of the light-emitting substrate has a common electrode arranged to the pixel electrode with a light-emitting layer interposed therebetween, and has a bus bar connected to the common electrode and arranged to have the same potential over the common electrode, and the bus bar is not in contact with the light-emitting layer and the pixel electrode.

In this case, the intermediate electrode may be arranged to overlap an entire upper surface of the bus bar in a non-contacting state with the bus bar.

The intermediate electrode may be elongated in parallel to a longitudinal direction of the bus bar. Alternately, the intermediate electrode may be elongated in a direction perpendicular to a longitudinal direction of the bus bar.

The intermediate electrodes may be arranged to correspond to pixel electrodes of RGB colors, respectively.

The intermediate electrode may be arranged to be elongated in parallel to an alignment direction of the pixels of the RGB colors. Alternately, the intermediate electrode may be arranged to be elongated in a direction perpendicular to a longitudinal direction of the pixel electrodes of the RGB colors.

The intermediate electrode may further be arranged to overlap an upper surface of other pixel electrodes of pixels adjacent to a connected pixel electrode in a non-contacting state. The intermediate electrode may be arranged to overlap an upper surface of other same-color pixel electrodes of pixels adjacent to a connected pixel electrode in a non-contacting state. The intermediate electrode may be arranged to overlap an upper surface of other different-color pixel electrodes of pixels adjacent to a connected pixel electrode in a non-contacting state.

The adjacent two intermediate electrodes may be arranged to have different combinations of connected pixel electrodes and pixel electrodes including overlapping pixel electrode.

The intermediate electrode may include an upper intermediate electrode and a lower intermediate electrode in a direction of thickness of the display apparatus. The upper intermediate electrode and the lower intermediate electrode included in one of the intermediate electrodes may be arranged to overlap different pixel electrodes.

The two adjacent intermediate electrodes may be arranged on different planes, respectively. An overlapping portion may be arranged between the two adjacent intermediate electrodes in a non-contacting state.

The intermediate electrodes may further have areas that are proportional to heat values of pixels.

The connection electrodes of the drive circuit substrate may be arranged diagonally to the longitudinal direction of the intermediate electrodes with respect to the pixel electrodes of the RGB colors.

The intermediate electrode may have a rectangular shape in the stacked plane. The connection electrode may have an isotropic shape in the stacked plane.

The drive circuit substrate includes:

a first base substrate;

a drive circuit arranged on the first base substrate; and a connection electrode connected to the drive circuit, wherein the light-emitting substrate includes:

a second base substrate;

a light-emitting unit configured by stacking a common electrode, a light-emitting layer, and a pixel electrode on the second base substrate; and an intermediate electrode connected to the pixel electrode.

In this case, the connection electrode of the drive circuit substrate and the intermediate electrode of the light-emitting substrate are stacked to each other to cause the connection electrode and the intermediate electrode to face each other and to connect the connection electrode and the intermediate electrode to each other.

On the stacked plane, the drive circuit substrate and the light-emitting substrate may be stacked to each other to make a direction in which expansion and contraction in the plane of the first base substrate of the drive circuit substrate are maximum parallel to the longitudinal direction of the intermediate electrode of the light-emitting substrate.

The common electrode may have a ground potential.

The drive circuit substrate and the light-emitting substrate may be stacked to each other with an insulating adhesive layer interposed therebetween on the stacked plane. It is to be noted that the adhesive layer is configured by diffusing an insulator.

The display apparatus may further include a ground electrode having a ground potential and developed in an in-plane direction of the stacked plane on the stacked plane between the drive circuit substrate and the light-emitting substrate.

In this case, the ground electrode is electrically insulated from the connection electrode of the drive circuit substrate and the intermediate electrode of the light-emitting substrate.

As described above, in the display apparatus according to the present invention, an intermediate electrode of the light-emitting substrate is arranged to be elongated in parallel to or perpendicular to a longitudinal direction of pixel electrodes in a stacked plane between the drive circuit substrate and the light-emitting substrate. In this manner, even though positions of the connection electrodes of the drive circuit substrate are slightly misaligned, a range of misalignment along the longitudinal direction of the intermediate electrode can be allowed. Therefore, a margin can be given to alignment accuracy in stacking between the drive circuit substrate and the light-emitting substrate. In this manner, a yield of the stacking step between the drive circuit substrate and the light-emitting substrate can be improved.

DESCRIPTION OF THE PREFERRED EMBODIMENTS

Figure 1:
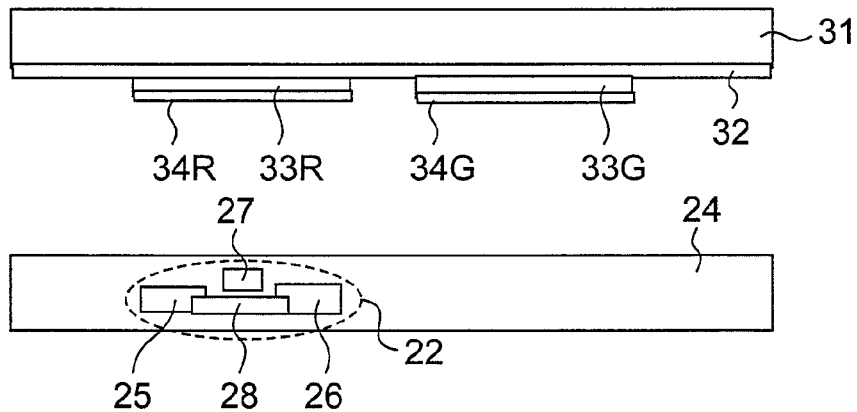
FIG. 1 is a schematic sectional view showing, in a method of manufacturing a display apparatus according to a first embodiment, a state in which TFTs are arranged on a lower drive circuit substrate and a common electrode, a light-emitting layer, and a pixel electrode are arranged on an upper light-emitting substrate.

A display apparatus according to embodiments of the present invention will be described below with reference to the accompanying drawings. The same reference numerals as in the drawings denote substantially the same members in the drawings.

First Embodiment

<Display Apparatus>

Figure 3:
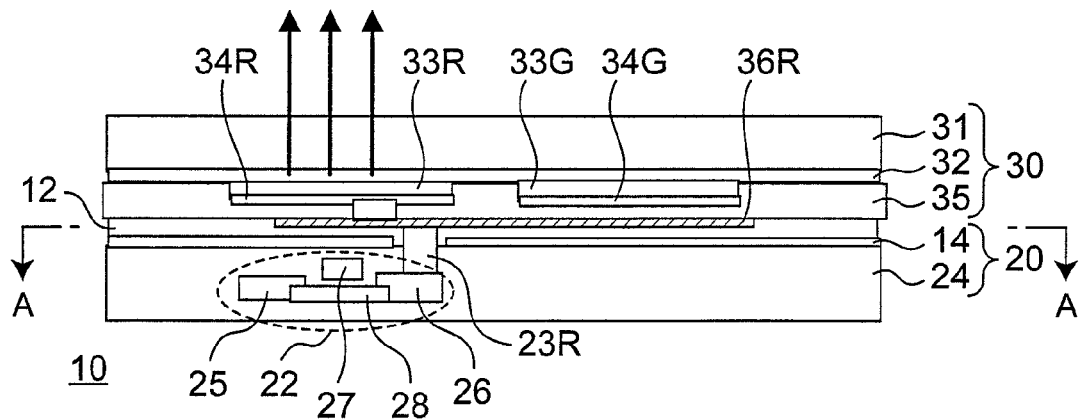
FIG. 3 is a schematic sectional view showing an overall configuration of the display apparatus according to the first embodiment.

FIG. 3 is a schematic sectional view showing an entire configuration of a display apparatus 10 according to a first embodiment. The display apparatus 10 includes a drive circuit substrate 20 having a drive circuit 22 and a light-emitting substrate 30 which is arranged to face the drive circuit substrate 20 and which has a light-emitting unit including a common electrode 32, a light-emitting layer 33, and a pixel electrode 34. As a characteristic feature of the display apparatus 10, the pixel electrode 34 is further connected to an intermediate electrode 36. The drive circuit substrate 20 and the light-emitting substrate 30 are stacked to each other by an insulating adhesive layer 12. On the stacked plane, a connection electrode 23 of a circuit substrate 20 is connected to the intermediate electrode 36 of the light-emitting substrate 30. On the drive circuit substrate 20 side of the stacked plane, a ground electrode 14 which is developed in an in-plane direction and which has a planar shape is arranged.

<Drive Circuit Substrate>

Figure 2:
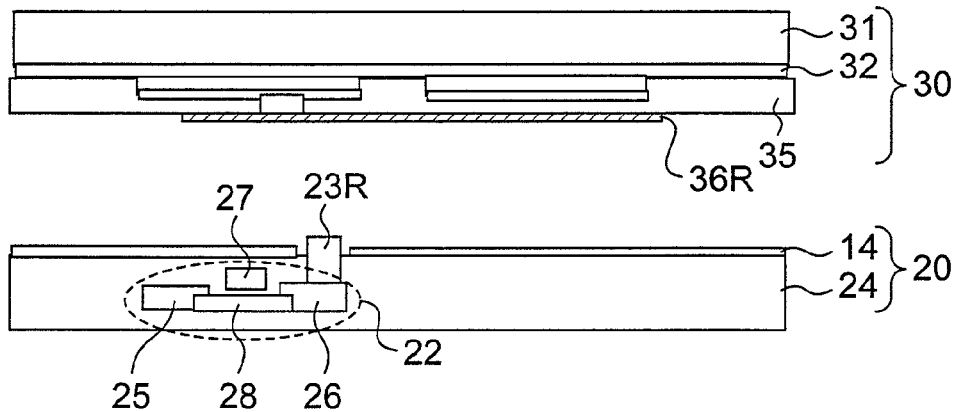
FIG. 2 is a schematic sectional view showing, in the method of manufacturing a display apparatus according to the first embodiment, a state in which a connection electrode and a ground electrode are arranged on the lower drive circuit substrate and an intermediate electrode is arranged on the upper light-emitting substrate.

A lower part of FIG. 2 is a sectional view of the display apparatus 10 when viewed in a direction parallel to a surface of the drive circuit substrate 20. The drive circuit substrate 20 includes an insulating layer 24, the drive circuit 22 arranged in the insulating layer 24, and the connection electrode 23 to electrically connect the drive circuit 22 to the light-emitting unit of the light-emitting substrate 30. The insulating layer 24 covers an upper surface of the drive circuit 22. The display apparatus 10 may have a first base substrate which supports the insulating layer 24. The drive circuit 22 includes a source electrode 25, a drain electrode 26, a gate electrode 27, and a semiconductor layer 28.

<Light-Emitting Substrate>

An upper part of FIG. 2 is a sectional view of the display apparatus 10 when viewed in a direction parallel to a surface of the light-emitting substrate 30. The light-emitting substrate 30 has a glass substrate (second base substrate) 31 having transparency. On the glass substrate 31, a light-emitting unit is arranged. The light-emitting unit is configured by the planar common electrode 32, light-emitting layers 33R, 33G, and 33B formed on the common electrode 32, and pixel electrodes 34R, 34G, and 34B arranged in units of RGB colors of pixels. The light-emitting layers 33R, 33G, and 33B are independently arranged so that lights of three colors of R, G, and B can be emitted. The pixel electrodes 34R, 34G, and 34B are independently formed on the light-emitting layers 33R, 33G, and 33B to emit lights of three colors R, G, and B, respectively. The pixel electrodes 34R, 34G, and 34B are connected to intermediate electrodes 36R, 36G, and 36B with an insulating layer 35 interposed therebetween, respectively, and the intermediate electrodes 36R, 36G, and 36B are electrically connected to the connection electrode 23 and formed to emit lights.

<Ground Electrode>

The drive circuit substrate 20 side has the ground electrode 14 which is developed in an in-plane direction is arranged on the stacked plane between the drive circuit substrate 20 and the common electrode 32. The ground electrode 14 has a shape, for example, a planar shape, a net-like shape, and a shape of a plurality of lines elongated in parallel to each other in one direction. The ground electrode 14 preferably has conductivity or preferable heat conductivity. As a material of the ground electrode 14, for example, a metal such as gold, silver, copper, or aluminum can be used.

The ground electrode 14 developed in the in-plane direction is arranged on the stacked plane to cause the ground electrode 14 to shield an electromagnetic wave from the drive circuit 22 and to make it possible to prevent erroneous light emission by a cross talk in the light-emitting unit on the light-emitting substrate 30. Due to the heat conductivity of a conductor, heat generated by the light-emitting unit is diffused through the ground electrode 14 in a plane shape. Heat generation at a portion having a low luminance and heat generation at a portion having a high luminance are uniformed, and deterioration in efficiency of the light-emitting unit caused by a temperature can be suppressed.

The connection electrode 23 of the drive circuit substrate 20 and the intermediate electrode 36 of the light-emitting substrate 30 are electrically connected to each other. As shown in FIG. 3 and FIGS. 5A, 5B, and 5C, the connection electrode 23 is electrically insulated with the ground electrode 14 in the same plane as that of the ground electrode 14. The drive circuit 22 and the light-emitting unit are electrically connected to each other through a connecting unit (the connection electrode 23 and the intermediate electrode 36) which is electrically insulated from the ground electrode 14.

Figure 4A:
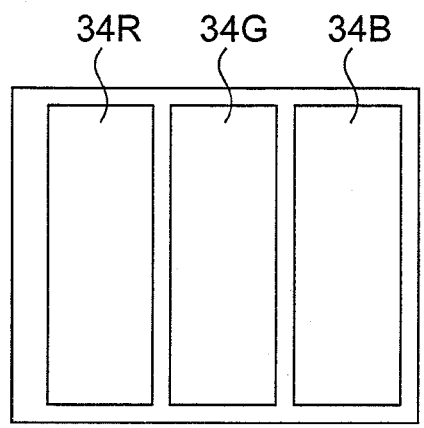
FIG. 4A is a plan view showing a configuration of a pixel electrode on a light-emitting substrate side of the display apparatus according to the first embodiment.
Figure 4B:
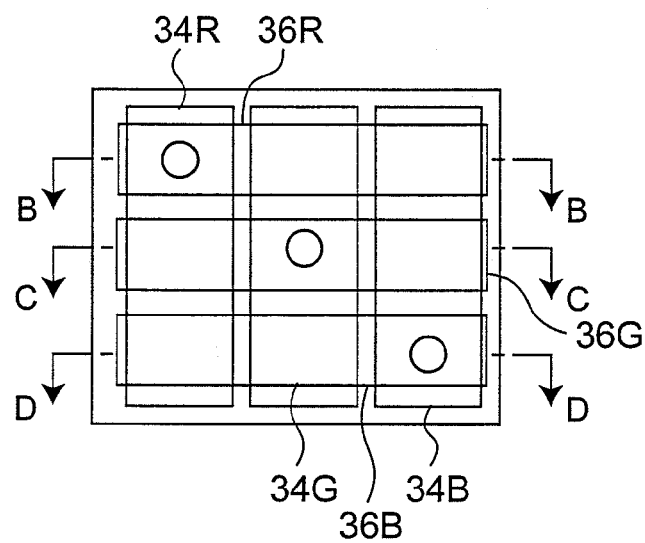
FIG. 4B is a sectional view along an A-A line in FIG. 3.

The intermediate electrode 36, as shown in FIG. 4B, has a rectangular shape in a stacked plane. A longitudinal direction of the intermediate electrode 36 is parallel to an alignment direction of the pixels of RGB colors, and is perpendicular to a longitudinal direction of the pixels of the RGB colors. The connection electrode 23 has an isotropic shape, more specifically, a circular shape in the stacked plane. The connection electrode 23 is diagonally arranged to the longitudinal direction of the intermediate electrode 36 for each of RGB colors of pixels.

On the stacked plane, the drive circuit substrate 20 and the light-emitting substrate 30 may be stacked to each other to make a direction in which expansion and contraction of the drive circuit substrate 20 in the plane of the first base substrate are maximum parallel to the longitudinal direction of the intermediate electrode 36 of the light-emitting substrate 30.

As described above, the intermediate electrode 36 of the light-emitting substrate 30 is made rectangular, and the connection electrode 23 of the drive circuit substrate 20 is made circular, so that the position of the connection electrode 23 can be allowed to be misaligned in a misalignment range along the longitudinal direction of the intermediate electrode 36 even though the position of the connection electrode 23 is slightly misaligned. The drive circuit substrate 20 and the light-emitting substrate 30 are stacked to each other such that the direction in which the expansion and contraction of the drive circuit substrate 20 in the plane of the first base substrate are maximum is parallel to the longitudinal direction of the intermediate electrode 36 of the light-emitting substrate 30, so that the alignment direction of the connection electrode 23 caused by distortion by the expansion and contraction of the drive circuit substrate 20 is aligned to the longitudinal direction of the intermediate electrode 36. In this manner, a margin can be given to alignment accuracy in stacking between the drive circuit substrate 20 and the light-emitting substrate 30. In this manner, a yield in the stacking step between the drive circuit substrate 20 and the light-emitting substrate 30 can be improved.

<Method of Manufacturing Drive Circuit Substrate>

The drive circuit substrate 20 shown in FIGS. 1 to 3 can be formed by the same process as a process of forming a substrate using a TFT formed in the processes in manufacturing a liquid crystal display apparatus. The drive circuit substrate 20 is formed by the following steps.

(a) A first base substrate (not shown) is prepared.

(b) a part of the insulating layer 24 and the drive circuit 22 are formed by a known method.

(c) The remaining part of the insulating layer 24 is further formed to cover almost an entire surface of the drive circuit 22 formed on the first base substrate (lower part in FIG. 1).

(d) Finally, in the same plane on the insulating layer 24, the plurality of connection electrodes 23 electrically connected to the drive circuit 22 and the ground electrode 14 insulated from the connection electrode 23 are formed (lower part in FIG. 2).

In this manner, the drive circuit substrate 20 is formed.

As a material of the connection electrode 23, various metals or various conductive oxides can be used. The connection electrode 23 can be patterned by a conventional photolithography technique. In the display apparatus 10 according to the first embodiment, the light-emitting layer 33 is formed on the light-emitting substrate 30 and is not formed on the drive circuit substrate 20. For this reason, the surface of the drive circuit substrate 20 need not be made in a plane shape.

The connection electrode 23 has an isotropic shape, in particular, a circular shape.

<Method of Manufacturing Light-Emitting Substrate>

A method of manufacturing the light-emitting substrate 30 shown in FIGS. 1 to 3 will be described below.

a) A second base substrate 31 having transparency is prepared. As the second base substrate 31 having transparency, a transparent substrate such as a glass substrate, a quartz substrate, or a plastic substrate can be used. A case using the glass substrate 31 will be described below. In the subsequent steps, since the light-emitting substrate 30 and the drive circuit substrate 20 are stacked to each other, as the material of the first base substrate of the drive circuit substrate 20 and the glass substrate 31 of the light-emitting substrate 30, the same material can be effectively used. When the materials of the first base substrate and the second base substrate 31 are different from each other, materials having at least similar thermal expansion coefficients are preferably used in order to suppress both the stacked substrates from being warped.

b) On the glass substrate 31, the common electrode 32 having transparency, the light-emitting layer 33, and the pixel electrode 34 are sequentially formed (upper part in FIG. 1). Since the second base substrate 31 and the light-emitting layer 33 are formed by a transparent material, a display light emitted from the light-emitting layer 33 is extracted outside the second base substrate 31.

As a method of forming the light-emitting layer 33 on the common electrode 32, when an polymer organic EL material is used, various applying methods typified by spin coating, a transfer method, a screen printing method, an ink-jet method, or the like is used. When a low-molecular organic EL material is used, a deposition method or the like is mainly used. In order to perform RGB color display to each pixel, light-emitting layers containing light-emitting materials depending on the RGB colors are separately formed in units of pixels of the colors. In this case, even though a color filter is arranged on an interface between the glass substrate 31 and the common electrode 32, the same effect can also be obtained.

c) After the insulating layer 35 is formed on the pixel electrode 34, the pixel electrode 34 is partially exposed.

d) Finally, the intermediate electrode 36 electrically connected to the pixel electrode 34 is arranged on the patterned insulating layer 35 (upper part in FIG. 2).

In this manner, the light-emitting substrate 30 is obtained.

The intermediate electrode 36 may have a shape elongated parallel to or perpendicular to the longitudinal direction of the pixel electrode 34. The intermediate electrode 36 has, for example, a rectangular shape. In particular, the longitudinal direction of the intermediate electrode 36 is parallel to an alignment direction of the pixels of the RGB colors and orthogonal to the longitudinal direction of the pixels of the RGB colors.

<Method of Manufacturing Display Apparatus>

Figure 4C:
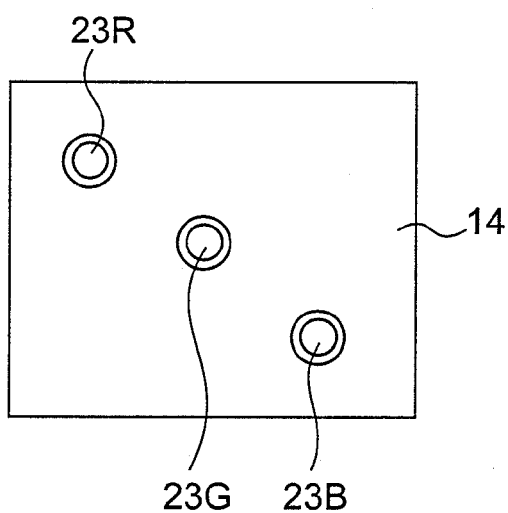
FIG. 4C is a plan view showing a configuration of a connection electrode on a drive circuit substrate side.

The drive circuit substrate 20 and the light-emitting substrate 30 which are formed by the above-described method are joined to each other by the adhesive layer 12 made of an insulating adhesive agent, so that the display apparatus 10 shown in FIG. 3 can be obtained. FIGS. 4A, 4B, and 4C are plan views of sides of the connecting part which electrically connects the drive circuit substrate 20 and the light-emitting substrate 30 and a transparent view of the connecting portion between the drive circuit substrate 20 and the light-emitting substrate 30. FIG. 4A is a schematic sectional view showing a configuration of the pixel electrode 34 on a light-emitting substrate 30 side, FIG. 4B is a sectional view along an A-A line in FIG. 3 and a transparent view showing an arrangement of connection electrodes 23R, 23G, and 23B, the intermediate electrodes 36R, 36G, and 36B, and the pixel electrodes 34R, 34G, and 34B. FIG. 4C is a schematic sectional view showing a configuration of a connecting portion on the drive circuit substrate 20 side. Frames in FIGS. 4A, 4B, and 4C indicate pixels including one set of three RGB colors. The pixels are divided into light-emitting units of the three RGB colors. In this manner, the display apparatus 10 can realize a color display function.

The connecting portion (connection electrode 23) on the drive circuit substrate 20 side and the connecting portion (intermediate electrode 36) on the light-emitting substrate 30 side are arranged to face each other and stacked to each other with the insulating adhesive layer 12 (FIG. 3) therebetween. In this case, the connection electrode 23 of the drive circuit substrate 20 and the intermediate electrode 36 of the light-emitting substrate 30 are electrically connected to each other through a contact hole formed in the ground electrode 14. When the level of a distal end of the connection electrode 23 is made higher than the level of the plane of the ground electrode 14 as shown in the lower part in FIG. 2, the display apparatus 10 can be configured when the connecting portions are stacked to each other without giving conductivity to the adhesive layer 12 itself.

As shown in FIG. 4C, the connection electrodes 23R, 23G, and 23B on the drive circuit substrate 20 side are arranged diagonally to an elongated direction of the pixel electrode in units of RGB colors. On the other hand, the intermediate electrodes 36R, 36G, and 36B are formed in rectangular shapes each having a longitudinal direction perpendicular to the elongated direction of the pixel electrodes (FIG. 4A). As a result, a margin can be given to stacking accuracy between the drive circuit substrate 20 and the light-emitting substrate 30.

In this case, the adhesive layer 12 is desirably insulative. For example, a conductive filler is present in the adhesive layer 12 between the ground electrode 14 and the connection electrode 23 to give conductivity to the adhesive layer 12, the risk of causing a short circuit increases. Therefore, the adhesive layer 12 is desirably insulative. An insulator such as a titanium oxide having a high heat conductivity is contained in the adhesive layer 12, so that heat generated by the light-emitting substrate 30 can be easily moved to the ground electrode 14 on the stacked plane between the light-emitting substrate 30 and the drive circuit substrate 20, and heat uniformity can be promoted. When a heat-conductive insulator is diffused in the adhesive layer 12, the size of the insulator must be smaller than a grain diameter which is equal to or smaller than a difference between the level of the connection electrode 23 and the level of the ground electrode 14 in order to suppress open failure between the drive circuit substrate 20 and the light-emitting substrate 30.

As described above, according to the first embodiment, the intermediate electrode and the planar ground electrode 14 having a ground potential are formed on the stacked plane between the drive circuit substrate 20 and the light-emitting substrate 30, which makes it possible to diffuse heat from the light-emitting substrate 30 to the entire area of the display apparatus 10. An electric signal from the drive circuit substrate 20 is shielded by the planar ground electrode 14 to suppress an interference of the light-emitting substrate 30 to the light-emitting unit, and also an influence of an electromagnetic wave from the intermediate electrode on the drive circuit. On the other hand, heat generated from the light-emitting substrate 30 is diffused to the entire area of the drive circuit substrate 20 through the planar ground electrode 14, so that a heat energy can be diffused to the entire area of the display apparatus 10 and a light-emitting efficiency of the light-emitting unit of the light-emitting substrate 30 can be secured. As a result, a display apparatus in which heat deterioration of the light-emitting unit and a fluctuation in drive current caused by heat in the drive circuit are suppressed can be obtained.

As shown in FIG. 4B, the connection electrode 23 of the drive circuit substrate 20 and the intermediate electrode 36 of the light-emitting substrate 30 are formed to make it possible to give a margin to alignment accuracy between the drive circuit substrate 20 and the light-emitting substrate 30. In this manner, a yield in the stacking step between the drive circuit substrate 20 and the light-emitting substrate 30 can be improved.

Figure 5A:
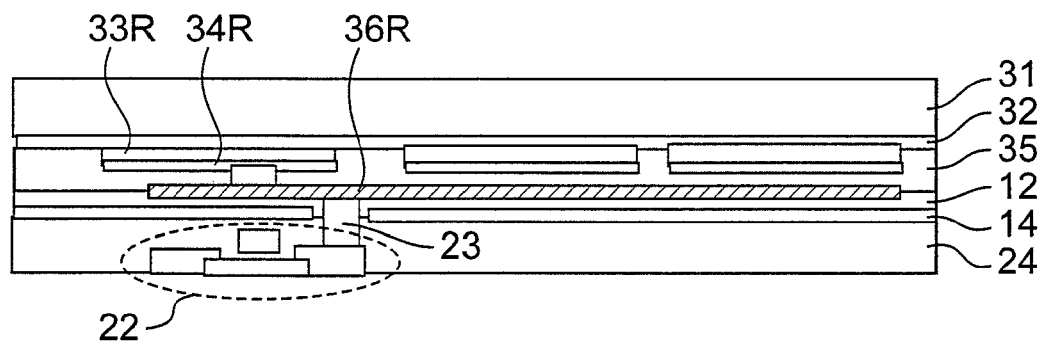
FIG. 5A is a sectional view along a B-B line in FIG. 4B.
Figure 5B:
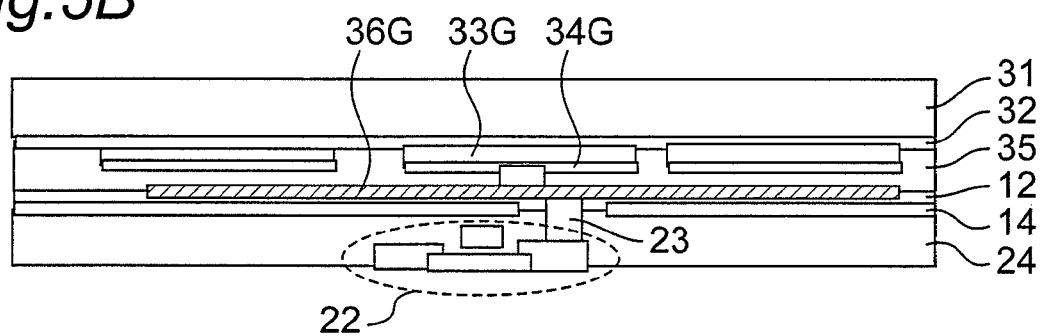
FIG. 5B is a sectional view along a C-C line in FIG. 4B.
Figure 5C:
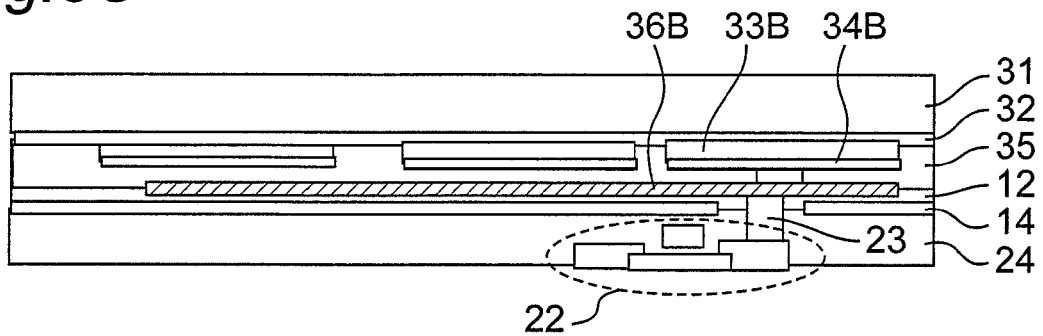
FIG. 5C is a sectional view along a D-D line in FIG. 4B.

FIG. 5A is a sectional view along a B-B line in FIG. 4B, FIG. 5B is a sectional view along a C-C line in FIG. 4B, and FIG. 5C is a sectional view along a D-D line in FIG. 4B. In the display apparatus 10, the intermediate electrodes 36R, 36G, and 36B are elongated in a direction perpendicular to the longitudinal direction of the pixel electrodes 34R, 34G, and 34B, and are arranged to overlap pixel electrodes of other adjacent different-color pixels in a non-contacting state. With the configuration, heat from the pixels can be diffused to adjacent pixels through the intermediate electrodes 36R, 36G, and 36B.

Figure 6B:
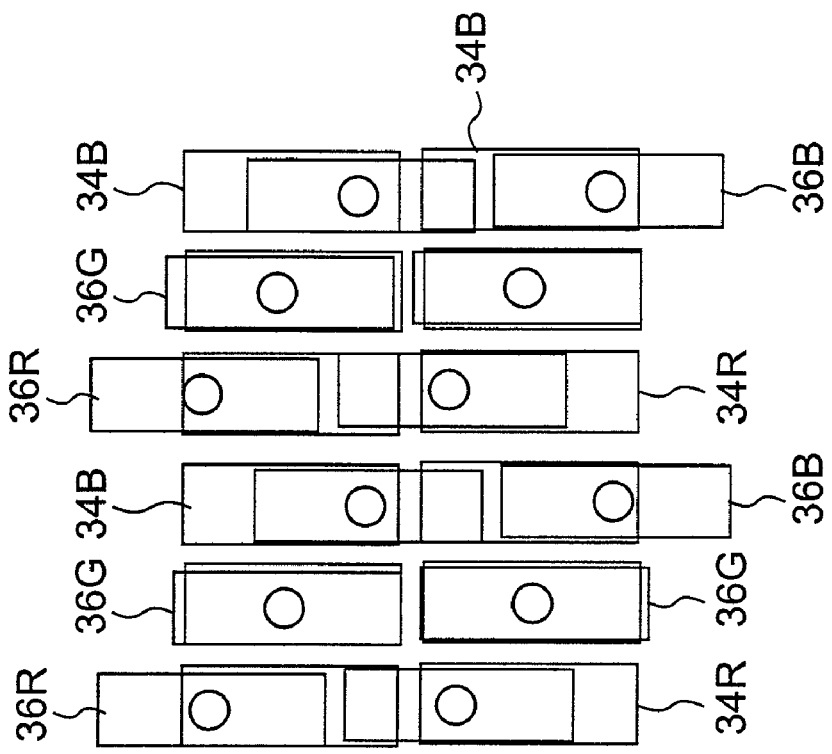
FIG. 6B is a diagram showing still another example of the arrangement of the intermediate electrode to the pixel electrode.
Figure 6A:
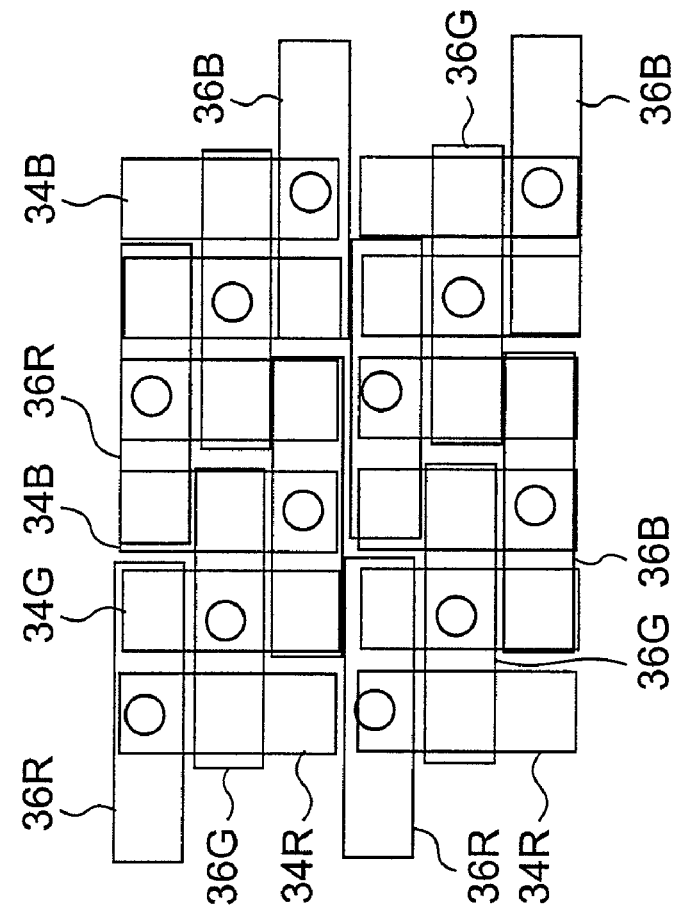
FIG. 6A is a diagram showing another example of an arrangement of the intermediate electrode to the pixel electrode.

FIG. 6A is a diagram showing another example of an arrangement of the intermediate electrode 36 to the pixel electrode 34, and FIG. 6B is a diagram showing still another example of the arrangement of the intermediate electrode 36 to the pixel electrode 34. In the first embodiment, as shown in FIG. 4B, the intermediate electrodes 36R, 36G, and 36B are elongated in a direction perpendicular to the longitudinal direction of the pixel electrodes 34R, 34G, and 34B, and are arranged to overlap pixel electrodes of other adjacent different-color pixels in a non-contacting state. The present embodiment is not limited thereto, but the configurations shown in FIGS. 6A and 6B may be employed.

As described in FIG. 6A and the sixth embodiment (will be described later), the intermediate electrodes 36R, 36G, and 36B may be elongated in the direction perpendicular to the longitudinal direction of the pixel electrodes 34R, 34G, and 34B, and may be arranged to overlap an entire upper surface of different-color pixel electrodes adjacent to one of the intermediate electrodes. Furthermore, pixel electrodes which the adjacent intermediate electrodes overlap may be arranged to be sequentially shifted. In other words, two adjacent intermediate electrodes have different combinations of connected pixel electrodes and pixel electrodes including the overlapping pixel electrodes.

Alternatively, as shown in FIG. 6B, the intermediate electrodes 36R, 36G, and 36B are elongated in parallel to the longitudinal direction of the pixel electrodes 34R, 34G, and 34B. Furthermore, for example, the intermediate electrode 36R connected one pixel electrode 34R may be arranged to overlap an entire upper surface of another pixel electrode 34R of an adjacent pixel of the same color. In addition, the pixel electrodes which adjacent intermediate electrodes overlap may be arranged to be sequentially shifted.

Second Embodiment

Figure 7A:
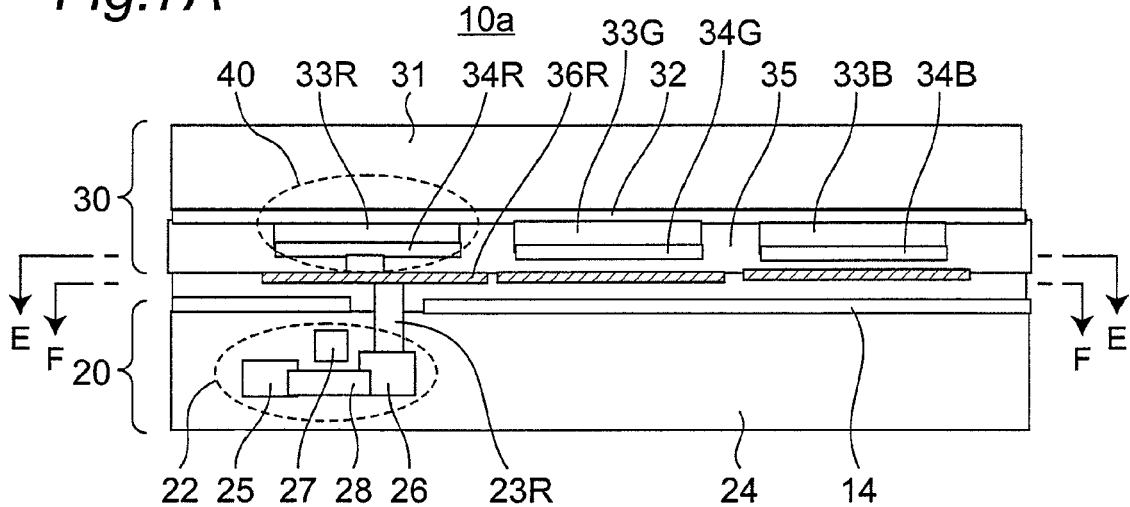
FIG. 7A is a schematic sectional view showing an overall configuration of a display apparatus according to a second embodiment.
Figure 7B:
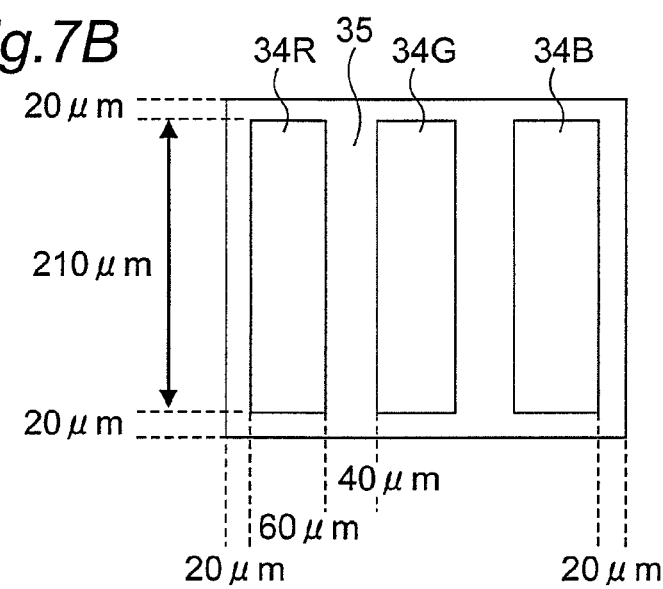
FIG. 7B is a sectional view along an E-E line in FIG. 7A.
Figure 7C:
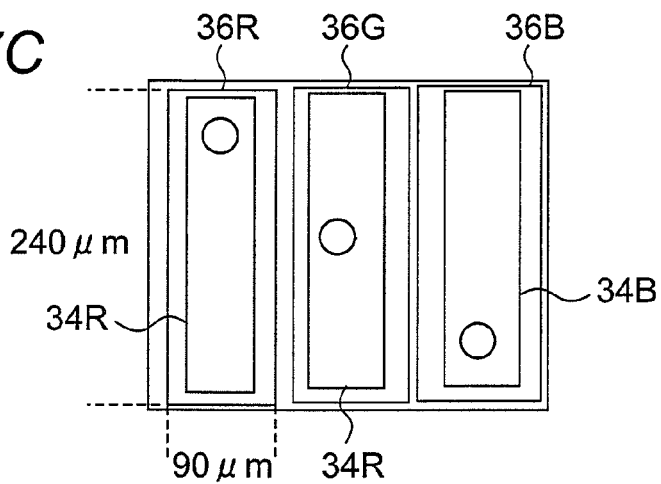
FIG. 7C is a sectional view along an F-F line in FIG. 7A.

FIG. 7A is a schematic sectional view showing an overall configuration of a display apparatus 10a according to a second embodiment, FIG. 7B is a sectional view along an E-E line in FIG. 7A, and FIG. 7C is a sectional view along an F-F line in FIG. 7A. As a characteristic feature of this display apparatus 10a, as shown in FIG. 7C, the intermediate electrodes 36R, 36G, and 36B has areas larger than the areas of the pixel electrodes 34R, 34G, and 34B, respectively.

On the other hand, in the conventional techniques described in Japanese Unexamined Patent Publication No. 2004-6337 and Japanese Unexamined Patent Publication No. 2005-208423, a connection electrode and a pixel electrode on a drive circuit substrate side are directly in contact with each other without an intermediate electrode.

In contrast to this, in the display apparatus 10a according to the second embodiment, the intermediate electrode 36 having an area larger than pixel electrode 34 is arranged, and the pixel electrode 34 and the connection electrode 23 are connected to each other with the intermediate electrode 36 interposed therebetween. For this reason, in comparison with the conventional techniques, alignment between the drive circuit substrate 20 and the light-emitting substrate 30 can be easily performed, and the connection electrode 23 and the intermediate electrode 36 can be reliably in contact with each other.

Even though only the pixel electrode 34 is to be largely formed, unevenness occurs due to constituent elements such as the light-emitting layer 33, processes are unstable due to a stepped cut of a film in film formation or an uneven resist in a photolithography state. In contrast to this, in the display apparatus 10a according to the second embodiment, since the insulating layer 35 on the light-emitting substrate 30 side functions as a planarizing film, the intermediate electrode 36 can be stably and accurately formed with a sufficient size by using a photolithography process.

Third Embodiment

Figure 8A:
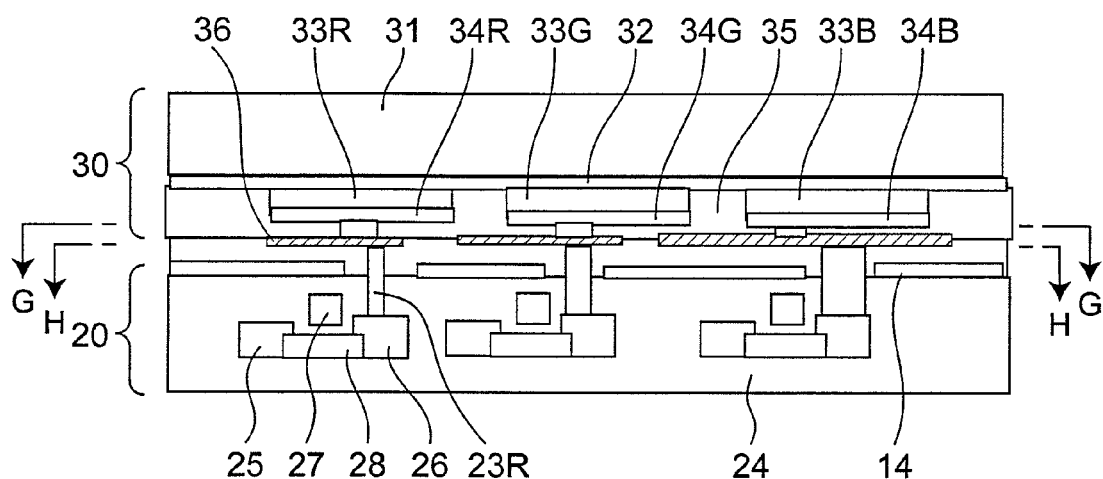
FIG. 8A is a schematic sectional view showing an overall configuration of a display apparatus according to a third embodiment.
Figure 8B:
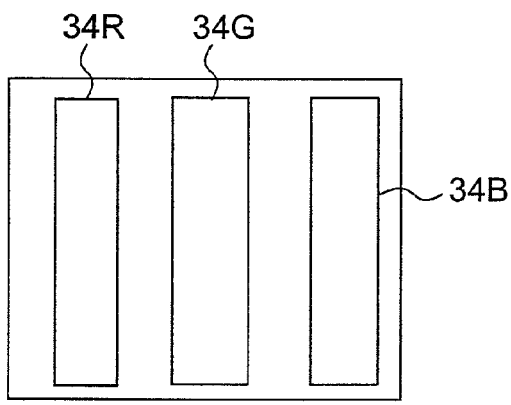
FIG. 8B is a sectional view along a G-G line in FIG. 8A.
Figure 8C:
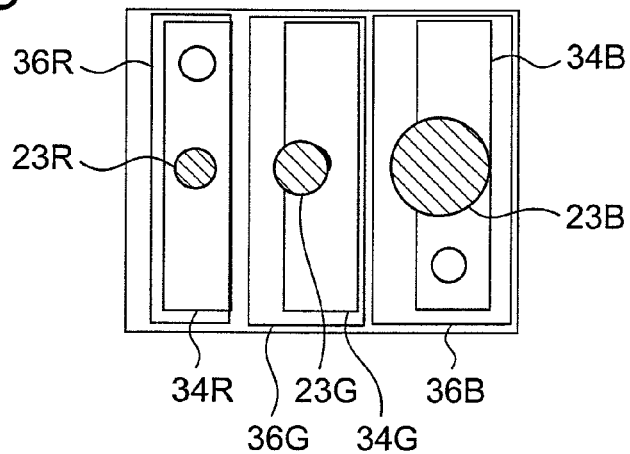
FIG. 8C is a sectional view along an H-H line in FIG. 8A.

FIG. 8A is a schematic sectional view showing an entire configuration of a display apparatus 10b according to the third embodiment, FIG. 8B is a sectional view along a G-G line in FIG. 8A, and FIG. 8C is a sectional view along an H-H line in FIG. 8A. As a characteristic feature of the display apparatus 10b, the sizes of the intermediate electrodes 36R, 36G, and 36B are set in the order of sizes of the connection electrodes 23R, 23G, and 23B. According to the configuration, when sizes of drive power supplies change depending on the colors, and when sizes of connection electrodes change depending on colors, a margin of alignment between the drive circuit substrate 20 and the light-emitting substrate 30 can be maximally obtained, and the connection electrode 23 and the intermediate electrode 36 can be reliably in contact with each other.

Fourth Embodiment

Figure 9A:
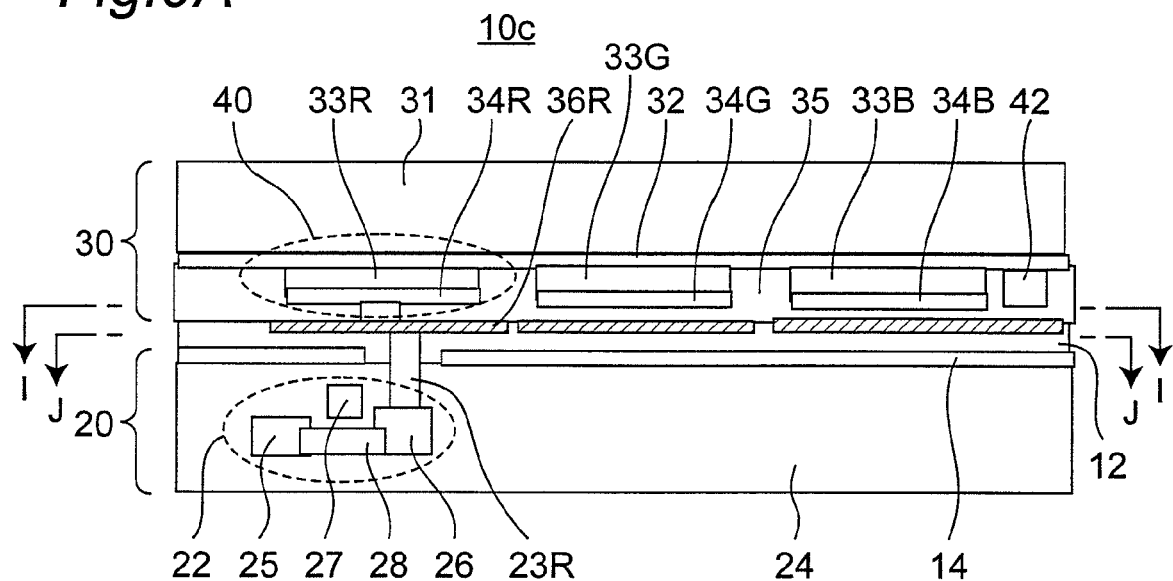
FIG. 9A is a schematic sectional view showing an overall configuration of a display apparatus according to a fourth embodiment.
Figure 9B:
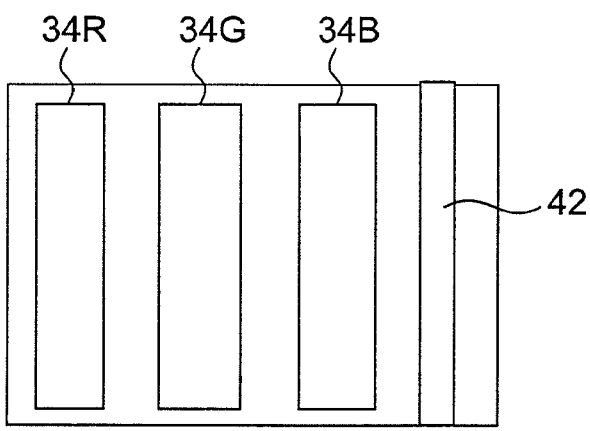
FIG. 9B is a sectional view along an I-I line in FIG. 9A.
Figure 9C:
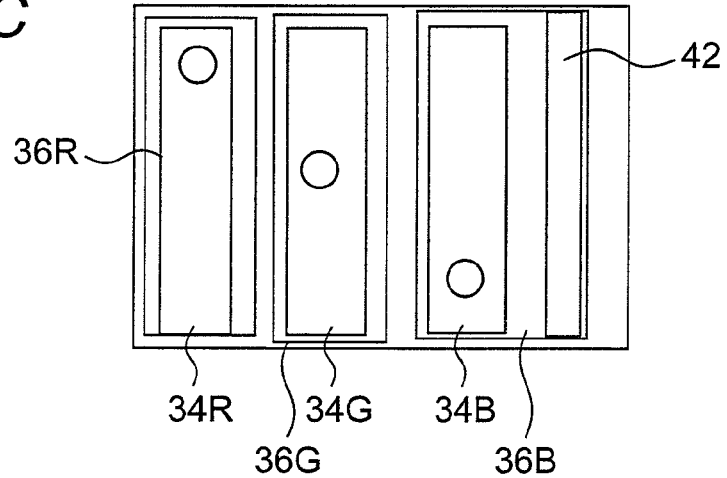
FIG. 9C is a sectional view along a J-J line in FIG. 9A.

FIG. 9A is a schematic sectional view showing an overall configuration of a display apparatus 10c according to a fourth embodiment, FIG. 9B is a sectional view along an I-I line in FIG. 9A, and FIG. 9C is a sectional view along a J-J line in FIG. 9A.

In general, a transparent electrode is used as the common electrode 32 in a light-emitting unit 40. However, the transparent electrode has a relatively high resistance, and, accordingly, dropping of a voltage applied to the light-emitting unit at a center portion of a screen disadvantageously occurs easier than at an edge portion of the screen. Therefore, in the display apparatus 10c, a bus bar 42 consisting of a metal or the like having an electric resistance lower than that of the common electrode is arranged so that the bus bar 42 is in contact with the common electrode 32 in order to solve the problem of the applied voltage dropping. The bus bar 42 is arranged to be elongated from one end of the common electrode 32 on the substrate 31 to the other end. The bus bar 42 can make potentials of portions of the bus bar 42 equal to each other, and the problem of the applied voltage dropping for each of the portions of the screen can be solved.

Furthermore, as a characteristic feature of the display apparatus 10c, the intermediate electrode 36B corresponding to the pixel electrode 34B on the side of the bus bar 42 has the largest size and is arranged to overlap an entire upper surface of the bus bar 42. According to the configuration, alignment between the drive circuit substrate 20 and the light-emitting substrate 30 can be easily performed. In addition, the pixel electrode 34B of a color having a large heat value can be reliably radiated from the bus bar 42 to the outside through the intermediate electrode 36B by arranging the intermediate electrode 36B corresponding to the pixel electrode 34 B on the entire upper surface of the bus bar 42.

Fifth Embodiment

Figure 10A:
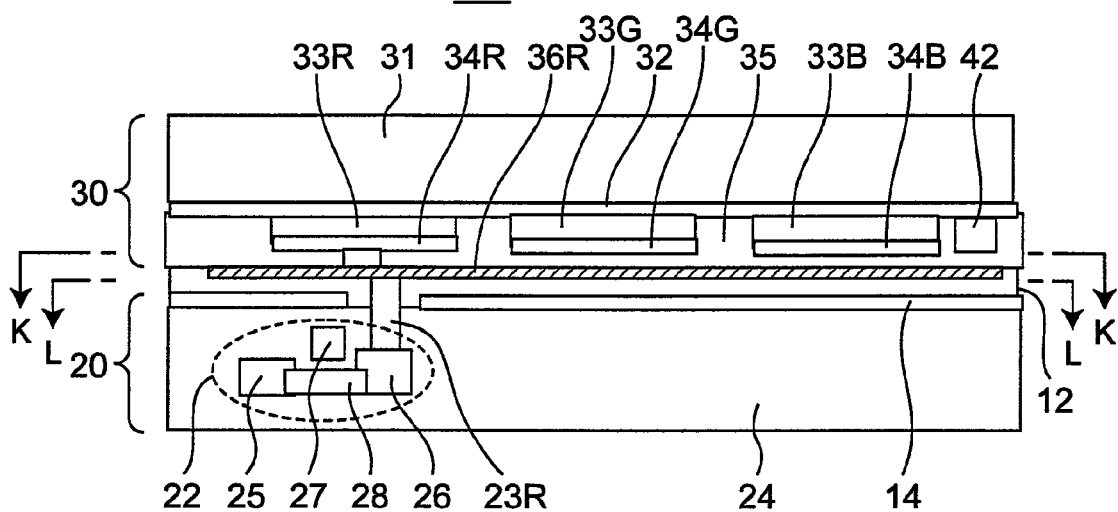
FIG. 10A is a schematic sectional view showing an overall configuration of a display apparatus according to a fifth embodiment.
Figure 10B:
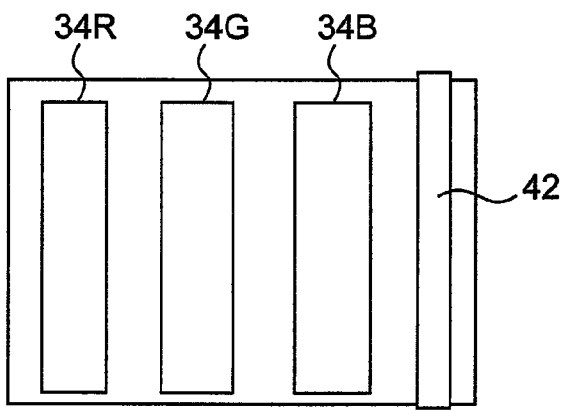
FIG. 10B is a sectional view along a K-K line in FIG. 10A.
Figure 10C:
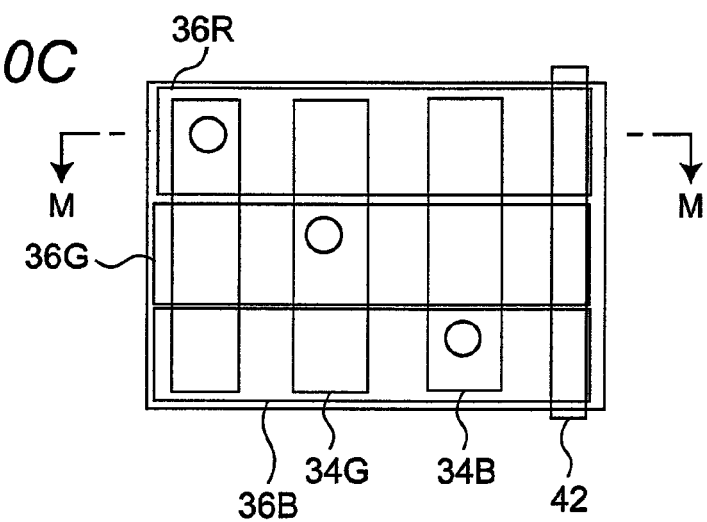
FIG. 10C is a sectional view along an L-L line in FIG. 10A.

FIG. 10A is a schematic sectional view showing an overall configuration of a display apparatus 10d according to a fifth embodiment, FIG. 10B is a sectional view along a K-K line in FIG. 10A, and FIG. 10C is a sectional view along an L-L line in FIG. 10A. As a characteristic feature of the display apparatus 10d, the intermediate electrodes 36R, 36G, and 36B are arranged to are elongated in a direction perpendicular to the longitudinal direction of the bus bar 42. Since the bus bar 42 is arranged in the same plane as that of the pixel electrodes 34R, 34G, and 34B, the bus bar 42 is arranged in parallel to the longitudinal direction of the pixel electrodes 34R, 34G, and 34B.

According to the configuration, since the intermediate electrodes 36R, 36G, and 36B corresponding to the pixel electrodes 34R, 34G, and 34B are elongated in a direction perpendicular to the longitudinal direction of the pixel electrodes 34R, 34G, 34B, and the bus bar 42, the sizes of the intermediate electrodes 36R, 36G, and 36B can be made maximum. For this reason, a margin of alignment when the drive circuit substrate 20 and the light-emitting substrate 30 are stacked to each other can be widened. Furthermore, the intermediate electrodes 36R, 36G, and 36B are arranged to overlap an entire upper surface of the bus bar 42, so that heat from the pixels can be reliably radiated from the intermediate electrodes 36R, 36G, and 36B to the outside through the bus bar 42.

Sixth Embodiment

Figure 11A:
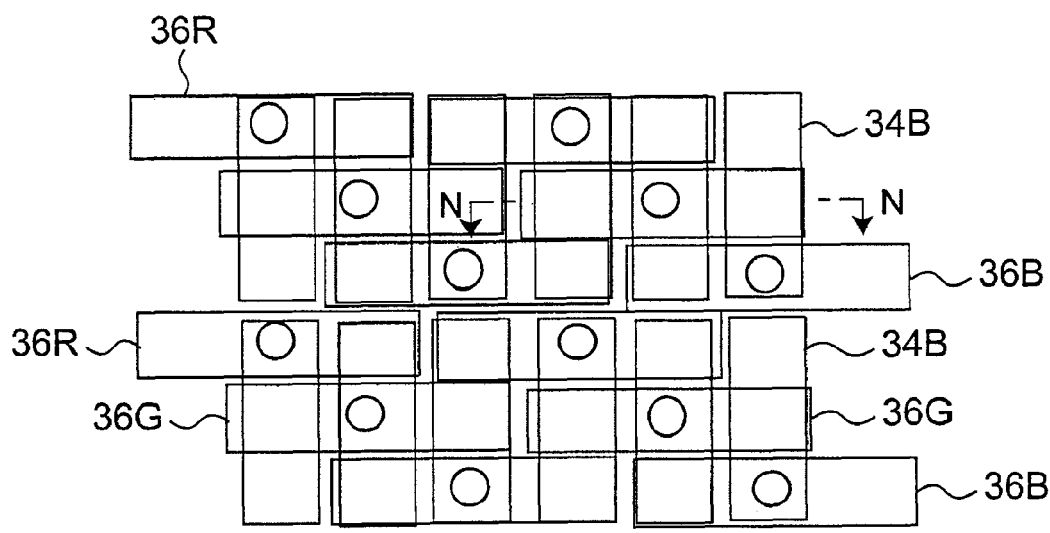
FIG. 11A is a schematic view showing an arrangement of an intermediate electrode to a pixel electrode in a display apparatus according to a sixth embodiment.
Figure 11B:
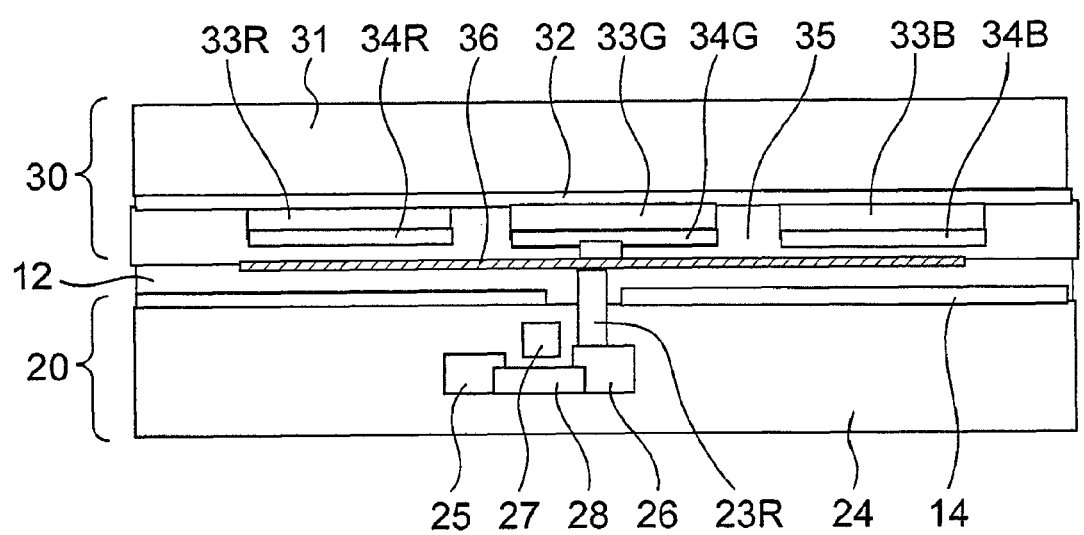
FIG. 11B is a sectional view along an N-N line in FIG. 11A.

FIG. 11A is a schematic view showing an arrangement of intermediate electrodes 36R, 36G, and 36B to the pixel electrodes 34R, 34G, and 34B in a display apparatus 10e according to a sixth embodiment, and FIG. 11B is a sectional view along an N-N line in FIG. 11A. The intermediate electrodes 36R, 36G, and 36B are elongated in a direction perpendicular to the longitudinal direction of the pixel electrodes 34R, 34G, and 34B, and are arranged to overlap an entire upper surface of different-color pixel electrodes adjacent to one pixel electrode in a non-contacting state. Furthermore, in the display apparatus 10e, pixel electrodes which the adjacent intermediate electrodes overlap are arranged to be sequentially shifted. In other words, two adjacent intermediate electrodes have different combinations between connected pixel electrodes and pixel electrodes including the overlapping pixel electrodes. In FIG. 11A, the three intermediate electrodes 36R, 36G, and 36B constitute one combination, and are arranged to be sequentially shifted. The present embodiment is not limited thereto, but, for example, the intermediate electrodes 36R, 36G, and 36B may be arranged in a zigzag form every two intermediate pixels.

According to the configuration, alignment in stacking between the drive circuit substrate 20 and the light-emitting substrate 30 can be easily performed. Furthermore, the intermediate electrodes 36R, 36G, and 36B are arranged to overlap the different-color pixel electrodes, and the pixel electrodes which the adjacent intermediate electrodes overlap are arranged to be sequentially shifted. Since heat generated by the pixels are widely diffused over the adjacent different-color pixels, differences between temperatures of different-color pixels can be suppressed, and irregular colors of the different-color pixels can be suppressed. As a result, a blur of a contour on the screen can be suppressed.

Seventh Embodiment

Figure 12A:
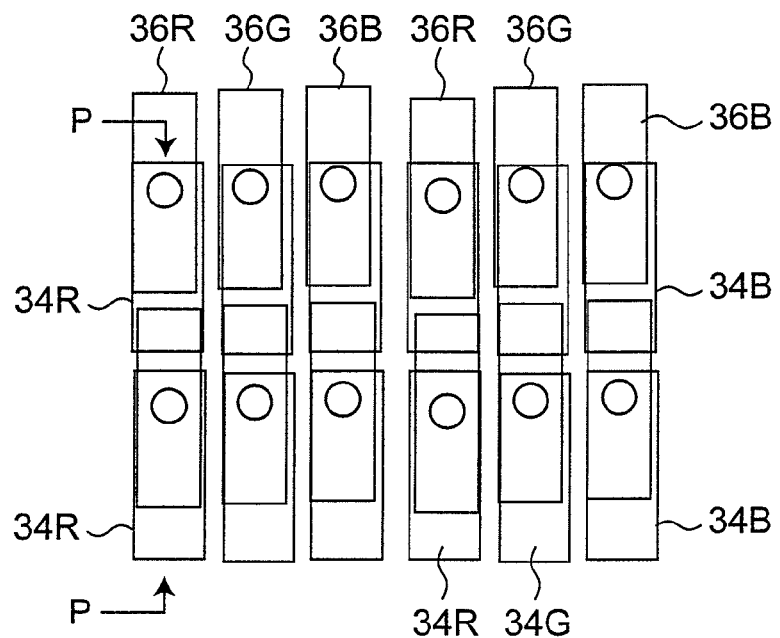
FIG. 12A is a schematic view showing an arrangement of an intermediate electrode to a pixel electrode in a display apparatus according to a seventh embodiment.
Figure 12B:
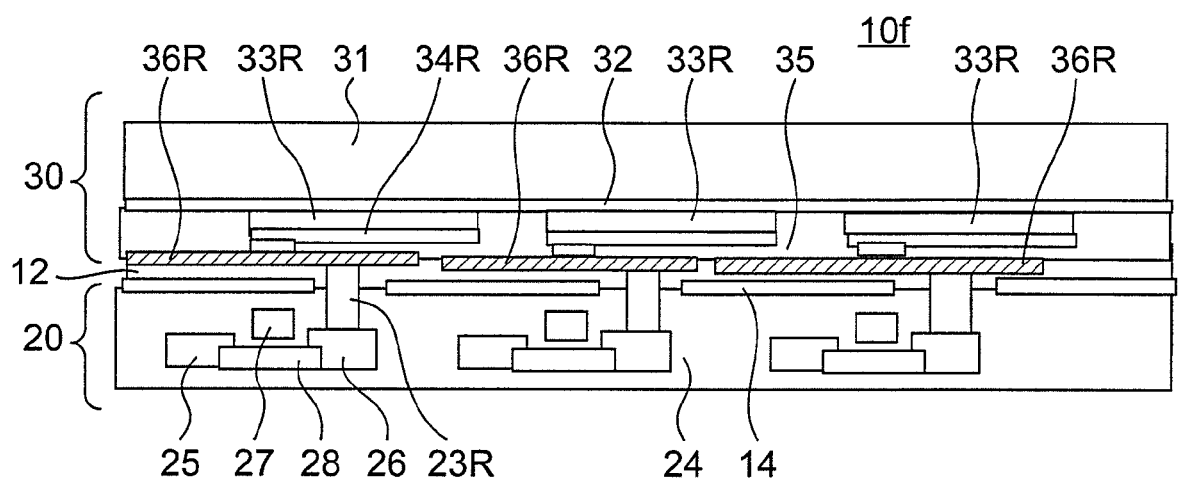
FIG. 12B is a sectional view along a P-P line in FIG. 12A.

FIG. 12A is a schematic view showing an arrangement of intermediate electrodes 36R, 36G, and 36B to the pixel electrodes 34R, 34G, and 34B in a display apparatus 10f according to a seventh embodiment, FIG. 12B is a sectional view along an P-P line in FIG. 12A. In this display apparatus 10f, the intermediate electrodes 36R, 36G, and 36B are elongated in parallel to the longitudinal direction of the pixel electrodes 34R, 34G, and 34B. Furthermore, as a characteristic feature, for example, as shown in FIG. 12B, the intermediate electrode 36R connected to one pixel electrode 34R is arranged to overlap an entire upper surface of another adjacent pixel electrode 34R of a pixel of the same color in a non-contacting state.

According to the configuration, alignment in stacking between the drive circuit substrate 20 and the light-emitting substrate 30 can be easily performed. Furthermore, since the intermediate electrodes are arranged to overlap other pixel electrodes of adjacent pixels of the same color, heat generated by one pixel can be diffused to the adjacent pixel electrodes of the same-color pixels. In this manner, differences between temperatures of adjacent same-color pixels can be suppressed, and irregular colors of the different-color pixels can be suppressed. As a result, a color blur can be suppressed.

Eighth Embodiment

Figure 13:
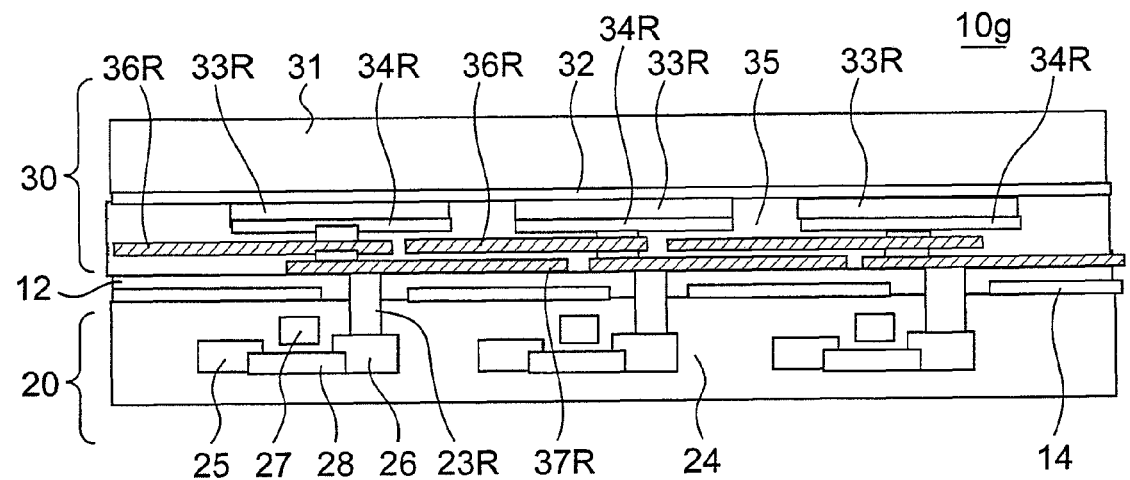
FIG. 13 is a schematic sectional view showing an overall configuration of a display apparatus according to an eighth embodiment.

FIG. 13 is a schematic sectional view showing an overall configuration of a display apparatus 10g according to an eighth embodiment of the present invention. As a characteristic feature of the display apparatus 10g, each of the intermediate electrodes includes two layers, i.e., an upper intermediate electrode 36R (36G and 36B are not shown) and a lower intermediate electrode 37R (37G and 37B are not shown). The intermediate electrode is not limited to a two-layered electrode, however, the intermediate electrode may have a multi-layered structure including three or more layers. As shown in FIG. 13, the intermediate electrode 36R and the lower intermediate electrode 37R are arranged to overlap an entire upper surface of other pixel electrodes of same-color pixels adjacent to connected pixel electrodes in a non-contacting manner. Furthermore, the upper intermediate electrode 36R and the lower intermediate electrode 37R are arranged to overlap pixel electrodes of different same-color pixels. In FIG. 13, the upper intermediate electrode and the lower intermediate electrode are elongated in the same direction. However, the present embodiment is not limited thereto, but the elongated direction of the upper intermediate electrode and the elongated direction of the lower intermediate electrode may be perpendicular to each other.

According to the configuration, alignment in stacking between the drive circuit substrate 20 and the light-emitting substrate 30 can be easily performed. Furthermore, since the area can be substantially enlarged by using the intermediate electrode having the multi-layered structure, heat can be reliably radiated from one pixel electrode to adjacent pixel electrodes. Furthermore, differences between temperatures of adjacent same-color pixels can be suppressed, and irregular colors of the same-color pixels can be suppressed. As a result, a color blur can be suppressed.

Ninth Embodiment

Figure 14:
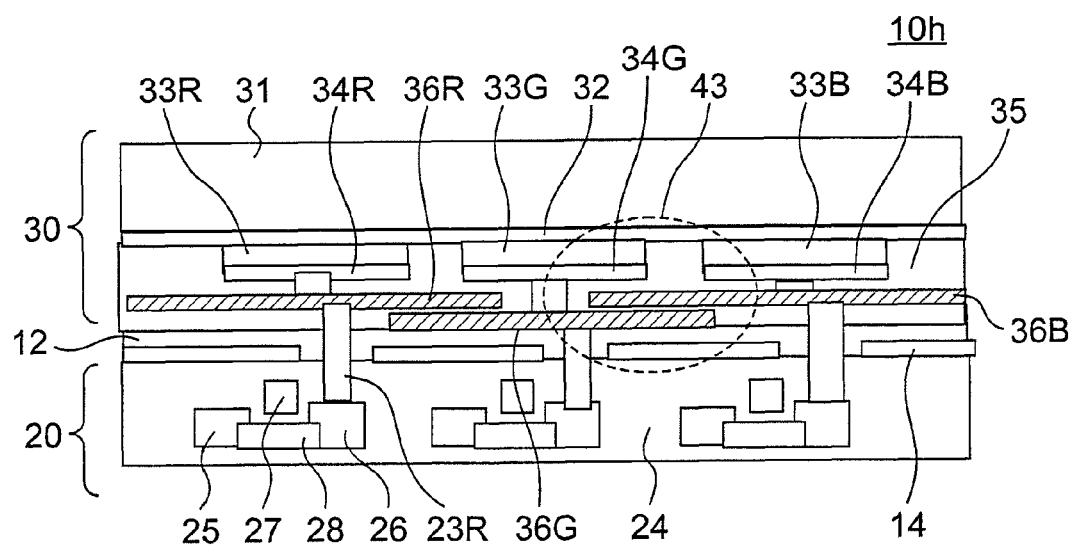
FIG. 14 is a schematic sectional view showing an overall configuration of a display apparatus according to a ninth embodiment.

FIG. 14 is a schematic sectional view showing an overall configuration of a display apparatus 10h according to a ninth embodiment of the present invention. As a characteristic feature of the display apparatus 10h, for example, in FIG. 14, one intermediate electrode 36G and other adjacent intermediate electrodes 36R and 36B are arranged on different planes. In this manner, the areas of the intermediate electrodes 36R, 36G, and 36B can be enlarged, and an overlapping portion 43 is arranged adjacent intermediate electrodes 36B in a non-contacting state.

According to the configuration, alignment in stacking between the drive circuit substrate 20 and the light-emitting substrate 30 can be easily performed. Furthermore, since the areas of the intermediate electrode can be enlarged by arranging the adjacent intermediate electrodes on different planes, heat can be reliably radiated from the pixel electrodes 34R, 34G, and 34B through the intermediate electrodes 36R, 36G, and 36B. In addition, the overlapping portion 43 between the intermediate electrodes can suppress an impurity from the drive circuit substrate 20, for example, diffusion of water ($H_2O$) to the light-emitting substrate 30 side.

Tenth Embodiment

Figure 15A:
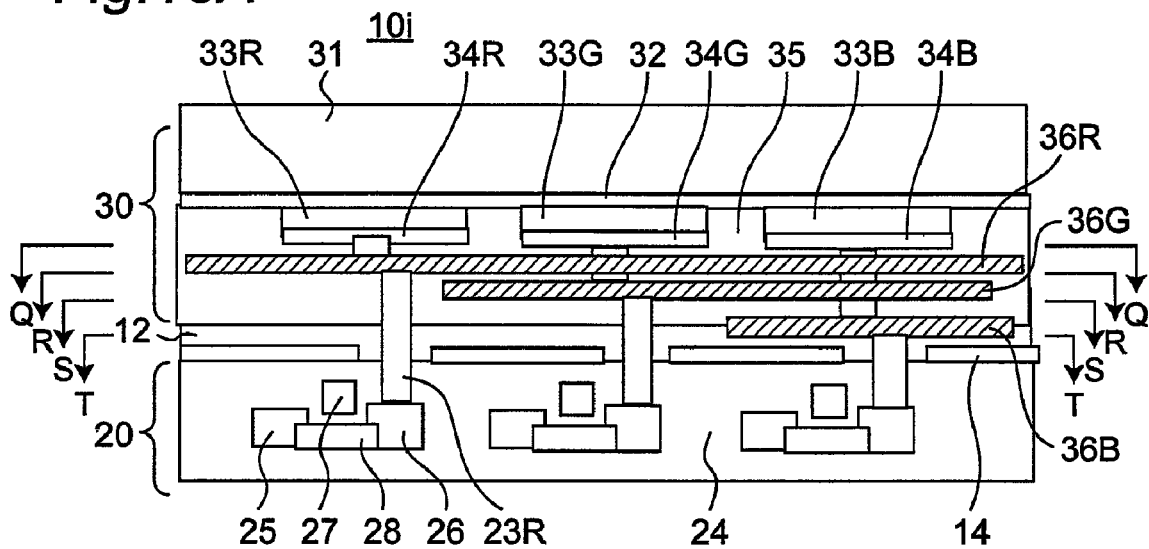
FIG. 15A is a schematic sectional view showing an overall configuration of a display apparatus according to a tenth embodiment.
Figure 15B:
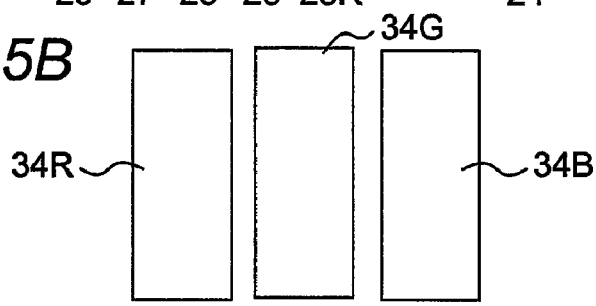
FIG. 15B is a sectional view along a Q-Q line in FIG. 15A.
Figure 15C:
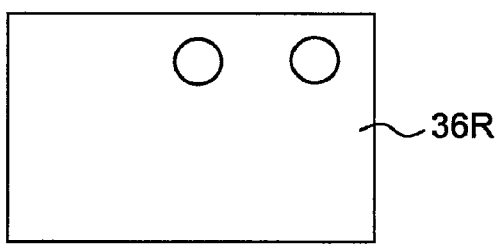
FIG. 15C is a sectional view along an R-R line in FIG. 15A.
Figure 15D:
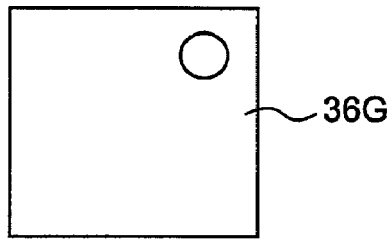
FIG. 15D is a sectional view along an S-S line in FIG. 15A.
Figure 15E:
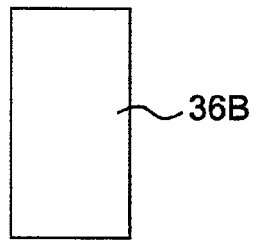
FIG. 15E is a sectional view along a T-T line in FIG. 15A.

FIG. 15A is a schematic sectional view showing an overall configuration of a display apparatus 10i according to a tenth embodiment, FIG. 15B is a sectional view along a Q-Q line in FIG. 15A, FIG. 15C is a sectional view along an R-R line in FIG. 15A, FIG. 15D is a sectional view along an S-S line in FIG. 15A, and FIG. 15E is a sectional view along a T-T line in FIG. 15A. As a characteristic feature of the display apparatus 10i, the intermediate electrodes are arranged to set the areas of the intermediate electrodes in an ascending order of heat values of pixels. More specifically, the area of the intermediate electrode 36R connected to the pixel electrode 34R is set to be maximum. The area of the intermediate electrode 36G connected to the pixel electrode 34G is secondarily large, and the area of the intermediate electrode 36B connected to the pixel electrode 34B is set to be minimum. The intermediate electrodes 36R, 36G, and 36B are arranged on different planes and maximally use the areas. Furthermore, the intermediate electrodes 36R, 36G, and 36B overlap in a non-contacting state.

According to the above configuration, alignment in stacking between the drive circuit substrate 20 and the light-emitting substrate 30 can be easily performed. Furthermore, since the area of the intermediate electrode 36R connected to the pixel having a large heat value can be made maximum, heat radiation can be reliably performed.

Eleventh Embodiment

Figure 16A:
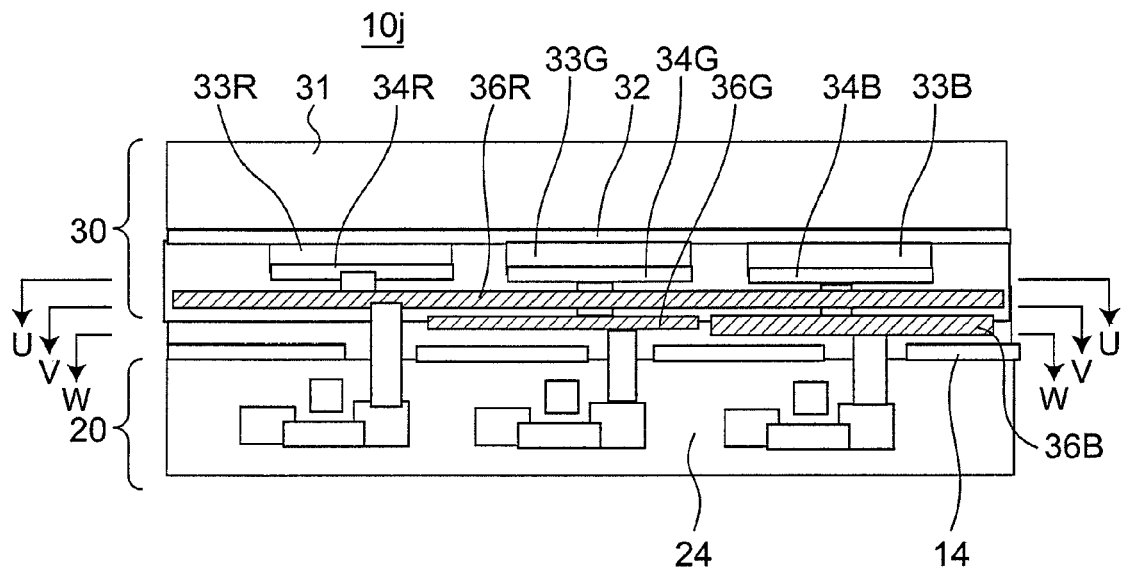
FIG. 16A is a schematic sectional view showing an overall configuration of a display apparatus according to an eleventh embodiment.
Figure 16B:
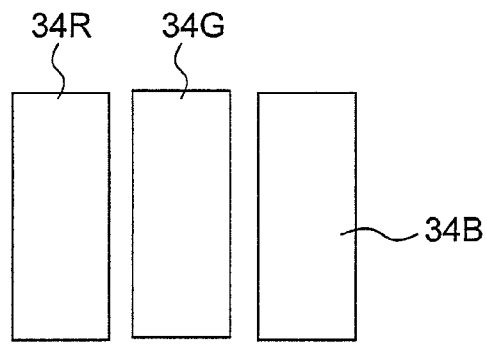
FIG. 16B is a sectional view along a U-U line in FIG. 16A.
Figure 16C:
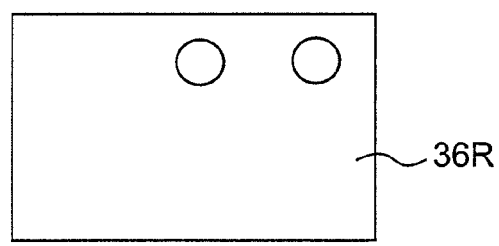
FIG. 16C is a sectional view along a V-V line in FIG. 16A.
Figure 16D:
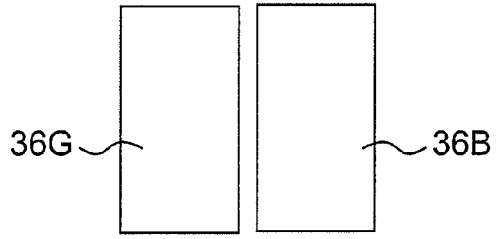
FIG. 16D is a sectional view along a W-W line in FIG. 16A.

FIG. 16A is a schematic sectional view showing an overall configuration of a display apparatus 10j according to an eleventh embodiment, FIG. 16B is a sectional view along a U-U line in FIG. 16A, FIG. 16C is a sectional view along a V-V line in FIG. 16A, and FIG. 16D is a sectional view along a W-W line in FIG. 16A. As a characteristic feature of the display apparatus 10j, similar to the tenth embodiment, the intermediate electrodes are arranged to set the areas of the intermediate electrodes in an ascending order of heat values of pixels. More specifically, the area of the intermediate electrode 36R connected to the pixel electrode 34R is set to be maximum. The area of the intermediate electrode 36G connected to the pixel electrode 34G and the area of the intermediate electrode 36B connected to the pixel electrode 34B are set to be equal to each other.

According to the above configuration, alignment in stacking between the drive circuit substrate 20 and the light-emitting substrate 30 can be easily performed. Furthermore, since the area of the intermediate electrode 36R connected to the pixel having a large heat value can be made maximum, heat radiation can be reliably performed. The intermediate electrodes 36G and 36B of the pixels having heat values which are not very large are arranged on the same plane to minimize the number of layers of the intermediate electrodes. Therefore, manufacturing costs can be reduced.

As described above, in the display apparatus according to the present invention, an intermediate electrode of a light-emitting substrate is arranged to be elongated in a parallel to or perpendicular to the longitudinal direction of pixel electrodes in a stacking plane between the drive circuit substrate and the light-emitting substrate. In this manner, even though positions of connection electrodes of the drive circuit substrate are slightly misaligned, a range of misalignment along the longitudinal direction of the intermediate electrode can be allowed. Therefore, a margin can be given to alignment accuracy in stacking between the drive circuit substrate and the light-emitting substrate. In this manner, an yield in the stacking step between the drive circuit substrate and the light-emitting substrate can be improved.

What is claimed is:

1. A display apparatus comprising:
   a drive circuit substrate including a drive circuit and a connection electrode;
   a light-emitting substrate including a light-emitting unit which includes pixel electrodes; and
   an intermediate electrode connected to the light-emitting unit of the light-emitting substrate,
   wherein the drive circuit substrate and the light-emitting substrate are stacked, so as to face each other,
   wherein, on a stacked plane between the drive circuit substrate and the light-emitting substrate, the intermediate electrode and the connection electrode are electrically connected to each other,
   wherein the intermediate electrode is elongated in a direction parallel to a longitudinal direction of a pixel electrode, of the pixel electrodes, on the stacked plane,
   wherein the intermediate electrode is arranged to overlap, in a non-contacting state, an upper surface of a same-color pixel electrode (i) other than the pixel electrode, (ii) that is a same color as the pixel electrode, and (iii) that is adjacent to the pixel electrode connected to the intermediate electrode,
   wherein the display apparatus further comprises a ground electrode having a ground potential and developed in an in-plane direction of the stacked plane on the stacked, so as to be arranged between the drive circuit substrate and the light-emitting substrate, and
   wherein the ground electrode is electrically insulated from the connection electrode of the drive circuit substrate and the intermediate electrode of the light-emitting substrate.

2. The display apparatus according to claim 1, wherein the intermediate electrode has an area larger than that of the pixel electrode connected to the intermediate electrode.

3. The display apparatus according to claim 1, wherein the intermediate electrodes have areas arranged in an order of area size of the connection electrodes.

4. The display apparatus according to claim 1, wherein the light-emitting unit of the light-emitting substrate has a common electrode arranged to the pixel electrode with a light-emitting layer interposed therebetween, and has a bus bar connected to the common electrode and arranged to have the same potential over the common electrode, and the bus bar is not in contact with the light-emitting layer and the pixel electrode, and
   the intermediate electrode is arranged to overlap an entire upper surface of the bus bar in a non-contacting state with the bus bar.

5. The display apparatus according to claim 4, wherein the intermediate electrode is elongated in parallel to a longitudinal direction of the bus bar.

6. The display apparatus according to claim 4, wherein the intermediate electrode is elongated in a direction perpendicular to a longitudinal direction of the bus bar.

7. The display apparatus according to claim 1, wherein the display apparatus includes a plurality of the intermediate electrodes, such that the intermediate electrodes are arranged to correspond to the pixel electrodes of RGB colors, respectively.

8. The display apparatus according to claim 7, wherein the intermediate electrodes are arranged to be elongated in parallel to an alignment direction of the pixel electrodes of the RGB colors.

9. The display apparatus according to claim 7, wherein the intermediate electrode is arranged to be elongated in a direction perpendicular to a longitudinal direction of the pixel electrodes of the RGB colors.

10. The display apparatus according to claim 7, wherein the intermediate electrodes are arranged to overlap, in the non-contacting state, the upper surface of other pixel electrodes (i) other than the pixel electrode and (ii) adjacent to the pixel electrode connected to the intermediate electrode.

11. The display apparatus according to claim 10, wherein two adjacent intermediate electrodes, of the intermediate electrodes, are arranged to have different combinations of connected pixel electrodes and pixel electrodes including an overlapping pixel electrode.

12. The display apparatus according to claim 7, wherein the intermediate electrode is arranged to overlap an upper surface of other different-color pixel electrodes of pixels adjacent to a connected pixel electrode in a non-contacting state.

13. The display apparatus according to claim 7, wherein the connection electrodes of the drive circuit substrate are arranged diagonally to the longitudinal direction of the intermediate electrodes with respect to the pixel electrodes of the RGB colors.

14. The display apparatus according to claim 1, wherein the intermediate electrode includes an upper intermediate electrode and a lower intermediate electrode in a direction of thickness of the display apparatus.

15. The display apparatus according to claim 14, wherein the upper intermediate electrode and the lower intermediate electrode included in one of the intermediate electrodes are arranged to overlap different pixel electrodes.

16. The display apparatus according to claim 1, wherein the two adjacent intermediate electrodes are arranged on different planes, respectively.

17. The display apparatus according to claim 16, wherein an overlapping portion is arranged between the two adjacent intermediate electrodes in a non-contacting state.

18. The display apparatus according to claim 1, wherein the intermediate electrodes have areas that are proportional to heat values generated from pixels.

19. The display apparatus according to claim 1, wherein the connection electrode has a rectangular shape in the stacked plane.

20. The display apparatus according to claim 1, wherein the intermediate electrode has an isotropic shape in the stacked plane.

21. The display apparatus according to claim 1,
   wherein the drive circuit substrate includes:
      a first base substrate;
      the drive circuit arranged on the first base substrate; and
      the connection electrode connected to the drive circuit,
   wherein the light-emitting substrate includes:
      a second base substrate;

a light-emitting unit configured by stacking a common electrode, a light-emitting layer, and the pixel electrodes on the second base substrate; and the intermediate electrode connected to a pixel electrode of the pixel electrodes, and wherein the connection electrode of the drive circuit substrate and the intermediate electrode of the light-emitting substrate are stacked, so as to cause the connection electrode and the intermediate electrode to face each other and to connect the connection electrode and the intermediate electrode to each other.

22. The display apparatus according to claim 21, wherein, on the stacked plane, the drive circuit substrate and the light-emitting substrate are stacked, so as to make a direction in which expansion and contraction in a plane of the first base substrate of the drive circuit substrate are a maximum in parallel to the longitudinal direction of the intermediate electrode of the light-emitting substrate.

23. The display apparatus according to claim 1, wherein an insulating adhesive layer is interposed between the drive circuit substrate and the light-emitting substrate on the stacked plane.

24. The display apparatus according to claim 23, wherein the insulating adhesive layer is a diffused insulator.

* * * * *